(12) United States Patent
Li et al.

(10) Patent No.: US 6,815,237 B1
(45) Date of Patent: Nov. 9, 2004

(54) TESTING APPARATUS AND METHOD FOR DETERMINING AN ETCH BIAS ASSOCIATED WITH A SEMICONDUCTOR-PROCESSING STEP

(75) Inventors: James Chingwei Li, San Diego, CA (US); Richard L. Pierson, Jr., Thousand Oaks, CA (US); Berinder P. S. Brar, Newbury Park, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/675,680

(22) Filed: Sep. 29, 2003

(51) Int. Cl.[7] .............................................. H01L 21/66
(52) U.S. Cl. .............................. 438/17; 438/5; 438/10; 438/14
(58) Field of Search .............................. 438/17, 5, 10, 438/14

(56) References Cited

U.S. PATENT DOCUMENTS

| | | | |
|---|---|---|---|
| 4,717,445 A | 1/1988 | Leung | 156/626 |
| 5,386,172 A * | 1/1995 | Komatsu | 313/309 |
| 5,837,995 A * | 11/1998 | Chow et al. | 250/214 LS |
| 6,697,697 B2 * | 2/2004 | Conchieri et al. | 700/121 |
| 2003/0103320 A1 * | 6/2003 | Shimada et al. | 361/508 |
| 2003/0229410 A1 * | 12/2003 | Smith et al. | 700/109 |
| 2004/0047112 A1 * | 3/2004 | Yoshida et al. | 361/523 |

OTHER PUBLICATIONS

E. G. Colgan, R.J. Polastre, M. Takeichi and R.L. Wisnieff, *Thin–Film–Transistor Process–Characterization Test Structures*, Feb. 12, 1998, http://www.research.ibm.com/journal/rd/423/polastre.txt.

* cited by examiner

*Primary Examiner*—Matthew Smith
*Assistant Examiner*—Victor V Yevsikov
(74) *Attorney, Agent, or Firm*—Koppel, Jacobs, Patrick & Heybl

(57) ABSTRACT

A testing apparatus for determining the etch bias associated with a semiconductor-processing step includes a substrate, a first cathode finger with a first width on the substrate, a second cathode finger with a second width on the substrate, and a cathode large area on the substrate wherein the cathode large area has a third width W" and a length L" that are both substantially larger than either of the first and second widths.

4 Claims, 7 Drawing Sheets

TESTING APPARATUS AND METHOD FOR DETERMINING AN ETCH BIAS ASSOCIATED WITH A SEMICONDUCTOR-PROCESSING STEP

BACKGROUND OF THE INVENTION

1. Field of the Invention

This invention relates to semiconductor processing, and more particularly to on-chip test structures for monitoring etch bias.

2. Description of the Related Art

Of particular interest to semiconductor design and manufacturing is the accurate determination of etch bias (the geometrical difference between the desired or drawn dimensions and the actual produced dimension). Accurate monitoring and control of etch biases is important for device modeling. Etch bias is affected by a number of variables in semiconductor processing, including types of materials doped, dopant types, electrical conductivity or insulation of layers beneath the etched layer, the amount and type of metal exposed during etching, and other variable properties which make anticipating and designing for etch-bias difficult.

Previous methods of monitoring etch bias in semiconductor processing include physically measuring the etch bias using some form of Transmission Electron Microscopy (TEM) or Scanning Electron Microsopy (SEM). For example, H. Leung describes an SEM technique in U.S. Pat. No. 4,717.445 that uses an etch-resistant structure as a reference, against which to optically measure the etch bias in a non-etch-resistant structure. Unfortunately, both TEM and SEM techniques involve stopping to clean the wafer or device of interest, cleaving the structure, and then optically verifying the etch bias. They are destructive to the structure, are time consuming to perform, and may result, in the case of SEM, in needless electron bombardment and further destruction of the sample. In addition to the destructive nature of these two techniques, the industry trend towards structure geometries below one micron precludes their use. Etch bias on the order of 0.1–0.2 microns (sub-micron) is difficult to measure accurately with TEM and SEM techniques.

More recently, etch bias has been determined through a technique called Resistive Line Width Bias (RLWB). This technique calculates the difference between measured and calculated resistance for a particular sample structure. RLWB is effective to measure lateral structures with the goal of finding a cross-sectional area. Unfortunately, RLWB does not work well when the purpose is to find the width of a material junction that has varied doping in a semiconductor device such as at a PN junction or at a junction that has lightly doped and heavily doped sides.

Therefore, there is a need for a technique to measure and monitor etch bias at material junctions that have varied doping for measurements in the sub-micron range.

SUMMARY OF INVENTION

A testing apparatus for determining the etch bias associated with a semiconductor-processing step includes a substrate, a first cathode finger with a first width on the substrate, a second cathode finger with a second width on the substrate, and a cathode platform on the substrate wherein the cathode platform has a third width W" and a length L" that are both substantially larger than either of the first and second widths.

In one embodiment of the invention, a method is described to calculate the etch bias, including measuring a capacitance between cathode and anode platforms to calculate a unit area capacitance, measuring a first finger capacitance between a first cathode finger and first anode finger both having a first width and measuring a second finger capacitance between a second cathode finger and second anode finger both having a second width different than the first width. The etch etch bias $\Delta$ is calculated from the unit area capacitance, the first finger capacitance and width, and the second finger capacitance and width.

In another embodiment, current measurements are used to calculate etch bias, including measuring a current response to a voltage applied across cathode and anode platforms to calculate a unit area current measuring a current response to a voltage applied across a first cathode finger and first anode finger both having a first width and measuring a current response to a voltage applied across a second cathode finger and second anode finger both having a second width different than the first width. The etch bias $\Delta$ is calculated from the unit area current, the first finger current response and width and the second finger current response and width.

BRIEF DESCRIPTION OF THE DRAWINGS

The components in the Figures are not necessarily to scale, emphasis instead being placed upon illustrating the principles of the invention. Moreover, in the Figures, like reference numerals designate corresponding parts throughout the different views.

DETAILED DESCRIPTION OF THE INVENTION

A Line Width Bias (LWB) system is described to determine the etch bias at a junction in a die subject to an etching process without the time consuming and destructive use of TEM and SEM methods of optical measurement. A test area is provided in the active area of a die and is configured with three or more test fixtures with each having a similarly doped PN, P+P– or N+N– junction. The first test fixture has a junction formed in a fingered pattern with both the length L and width W of each finger greater than any process variation and where L is far greater than W. The second test fixture also has a junction with the same doping and formed in a fingered pattern, with each finger having the same length L and with either a smaller or greater width W'. The third test fixture also has a junction with the same doping, but is generally square, rectangular or circular in shape. If the fixtures have a PN junction doping, capacitances of the junctions are measured and a unit area capacitance calculated from the third fixture. If the fixtures have P+P− or N+N− junction doping, the currents are measured in response to a voltage and a unit area current is calculated from the third fixture. Both the unit area capacitance and current are independent of process variation and etch bias. The differences between measured capacitances or currents at the junctions, finger widths and calculated unit area capacitance or unit area current in response to voltage are translated into etch bias measurements to improve modeling of performance or to change the die's layout to improve manufacturing accuracy.

Figure 1:
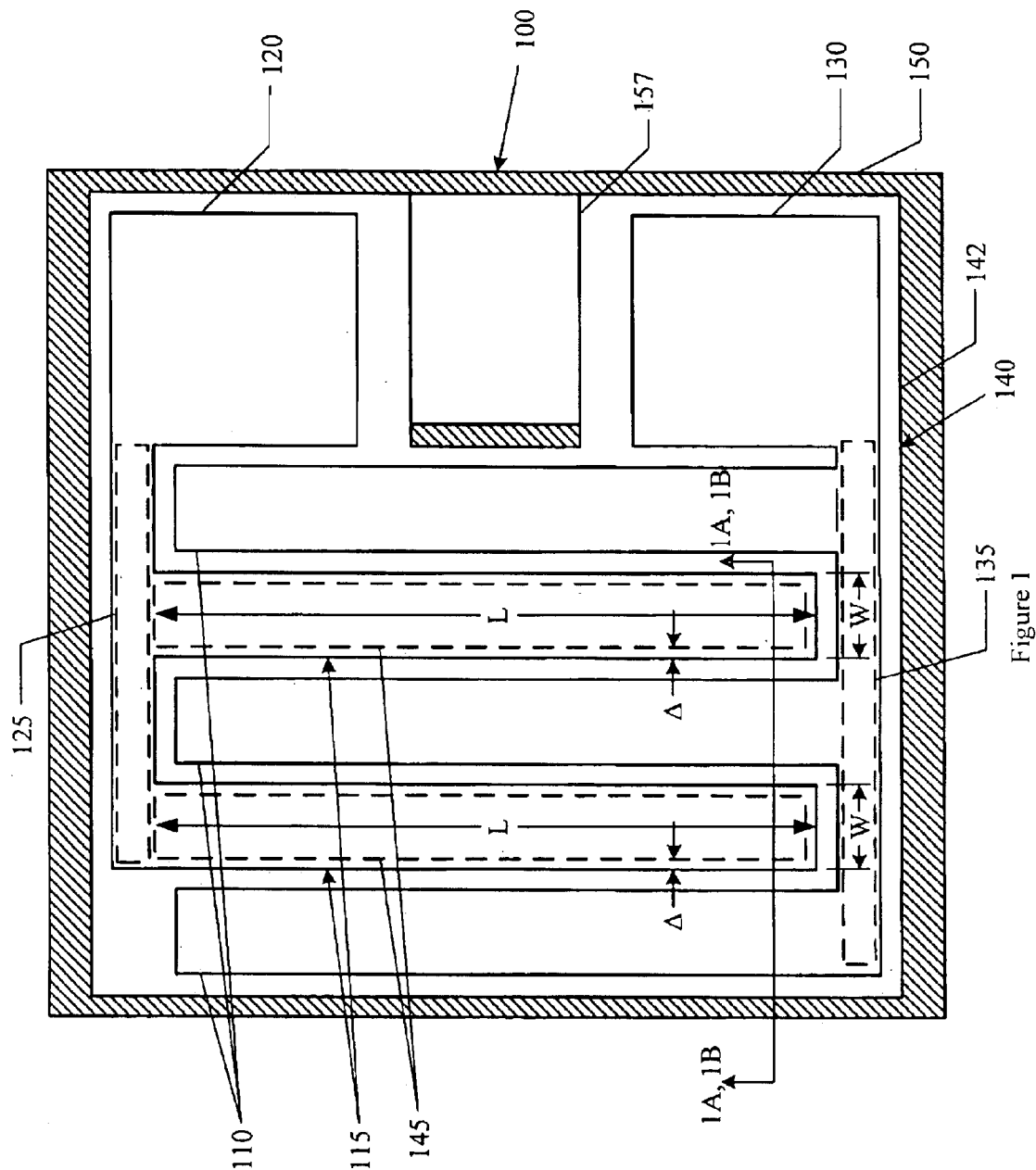
FIG. 1 is a plan view showing a first test fixture 100 on a semiconductor substrate that, in one embodiment, has interdigitated anode and cathode test fingers, with the cathode test fingers having a width W.

FIG. 1 shows a plan view of a first test fixture 100 which has, in one embodiment, a junction formed in the shape of multiple test fingers. The first test fixture 100 has interdigitated first anode and cathode fingers (110, 115) in a parallel arrangement. The cathode fingers 115 have a length L and width W, and the anode fingers preferably have the same length and width. The fingers (110, 115) can also form an interdigitated circular or zigzag pattern. Or, the fixture 100 can have only one set of parallel, circular, or zigzag pattern fingers. First cathode fingers 115 are connected to a first cathode pad 120 through a first cathode bus 125 to allow the fingers 115 and pad 120 to communication a voltage and current. The length L of each first cathode finger 115 is much greater than its width W, and both dimensions measure longer than the expected etch bias Δ. The first anode fingers 110 are connected to a first anode pad 130 through a first anode bus 135 to enable communication of a voltage and current between the fingers and pad.

A first pedestal 140 extends beneath the first anode and cathode fingers (110, 115) and the first cathode and anode buses (125, 135). It has a top layer that is either P or P+ doped ("anode layer 142"), depending on whether capacitance or current, respectively, is used to calculate etch bias. The anode layer 142 establishes a first junction 145 with each first cathode finger 115 as indicated by dashed lines. The width of each first junction 145 is less than the width W by an amount equal to twice the etch bias (2Δ) experienced by each first cathode finger during its etching process. The first pedestal 140 can be on an N+ sub-collector layer 150 to establish an ohmic contact for the first pedestal 140. The N+ sub-collector layer 150 can be coupled to a collector pad 157 that is a probe contact point for the first test fixture 100 if the first test fixture is formed as a transistor. In such a case, the anode and cathode fingers (110, 115) would form base and emitter fingers, respectively, to form an NPN transistor as described, below. Or, if only the etch bias Δ associated with the first PN junction 145 will be measured, the N+ sub-collector layer 150 can be omitted from the first test fixture 100.

Figure 1A:
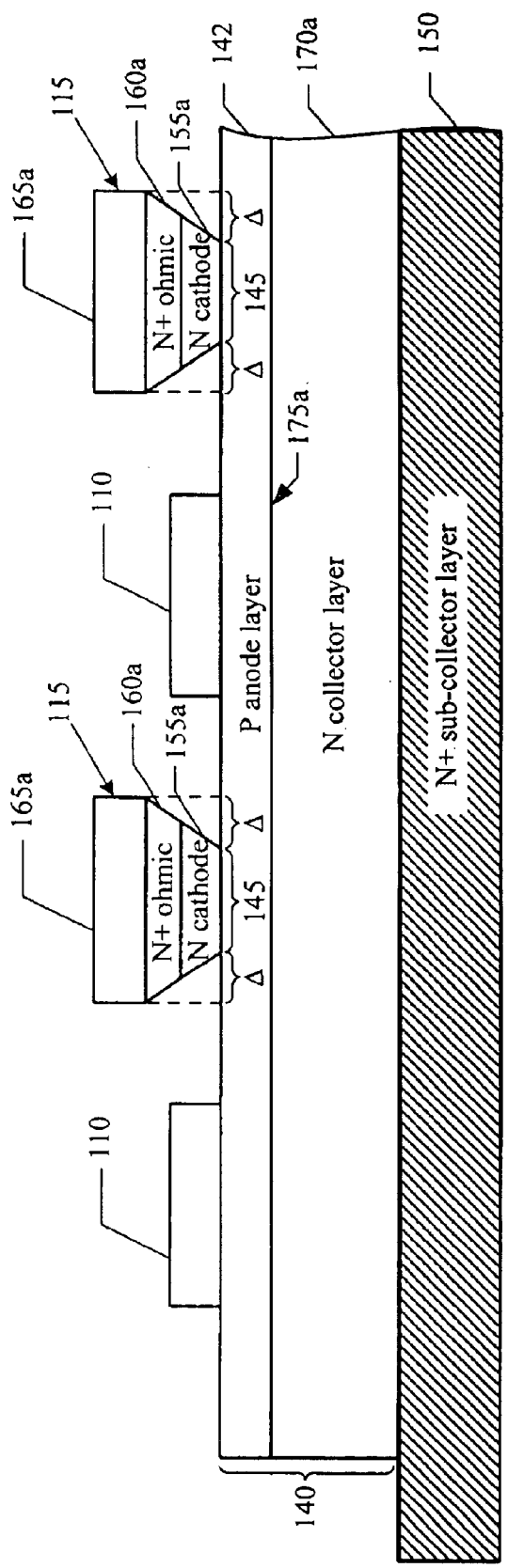
FIG. 1A is a cross-section view of the embodiment of the invention shown in FIG. 1 along the line 1A—1A and configured to find edge bias using capacitance measurements.

FIG. 1A is a cross sectional view taken along section line 1A—1A for, in one embodiment, the first test fixture 100 illustrated in FIG. 1 using a PN junction to calculate etch bias from capacitance measurements. The first cathode fingers 115 are on the anode layer 142 that is P doped. The fingers 115 are defined by, in part, an N cathode layer 155a on the anode layer 142 to establish the first junction 145 as a PN junction. Each first cathode finger also has an N+ ohmic layer 160a on the N cathode layer 155a to establish an ohmic contact with a cathode contact 165a. The cathode contact 165a is coupled to the first cathode pad 120 through the first cathode bus 125 (FIG. 1) to provide the first cathode pad 120 with communication to the first junction 145. Although the N+ ohmic and N cathode layers (160a, 155a) are etchable, the cathode contact 165a of each first cathode finger 115 is substantially conductive and etch-resistant. Preferably, the cathode contact 165a is formed from a metal. The etch bias Δ is illustrated as the change in width on either side of the first cathode finger at the first junction 145, the change resulting from the etching process. The total change in width of each first cathode finger 115 at its first junction 145 is 2Δ.

The first pedestal 140 includes an N collector layer 170a extending beneath the anode layer. 142 to form an internal junction 175a within the first pedestal 140. The N collector layer 170a is coupled to the first collector pad 157 (FIG. 1) through the N+ sub-collector layer 150 to provide electrical communication between the pad 157 and the second junction 175a.

In this embodiment, layers 155a, 142 and 170a establish an NPN transistor with the first cathode, anode and collector pads (120, 130, 157) establishing probe points.

Application of a voltage between the first anode and cathode pads (130, 120) results in a measurable capacitance between them. The capacitance is a function of first cathode finger length L and width W, etch bias Δ, and the perimeter capacitance $C_P$ created between the etched vertical walls of the first cathode fingers 145 and the P anode layer 142. More particularly, the measured capacitance for each finger $C_F$ is described by:

$$C_F = C_A(L-\Delta)(W-\Delta) + 2C_P(L+W-2\Delta) \quad (1)$$

where $C_A$ is the capacitance per unit area at the first PN junction 145.

The dopant types described above for newly introduced elements in FIG. 1A may be reversed. For example, if the P doped anode, N collector, and N+ sub-collector layers (142, 170a, 150) are oppositely doped, the N+ ohmic contact, N cathode and N collector layers (160a, 155a, 170a) would be doped P+, P, and P, respectively.

In an example, the N+ sub-collector and N collector layers (150, 107a) are preferably formed with Indium Gallium Arsenide (InGaAs), but can be formed with another semiconductor material such as Indium Phosphide (InP). The P anode layer 142 is preferably formed with Gallium Arsenide Antimonide (GaAsSb). The N cathode layer 155a is preferably formed of from InP, but can be formed from another semiconductor material such as InAlAs. Similarly, the N+ cathode ohmic layer is preferably formed of InGaAs, but can be formed from another semiconductor material such as InAlAs.

Thicknesses of the various regions are dictated by the processing step to be monitored. For example, for a test fixture designed for a series of test voltages ranging from −1 to 0.5 volts between the first anode and cathode pads (130, 120) and a first cathode finger length L and width W of 100 and 1 microns, respectively, the various elements have the approximate thicknesses listed in Table 1.

TABLE 1

|  | Thickness (microns) |
| --- | --- |
| P anode layer 142 | 0.05 |
| N+ sub-collector layer 150 | 0.4 |
| N cathode layer 155a | 0.05 |
| N+ ohmic contact 160a | 0.2 |
| Cathode contact 165a | 0.2 |
| N collector layer 170a | 0.3 |
| N+ sub-collector layer | 0.4 |

It may be appreciated, however, that normal transistor design rules are utilized in the process to be monitored. A "+" (i.e., P+ or N+) typically denotes a carrier concentration of at least $1 \times 10^{18}/cm^3$, and a "−" typically denotes a carrier concentration of less than $5 \times 10^{16}/cm^3$. For example, the N cathode layer 155a is preferably doped to approximately $5 \times 10^{17}$ cm$^{-3}$ with an N-type donor (Nd). The P-anode layer 106 is preferably doped to approximately $5 \times 10^{19}$ cm$^{-3}$ with a P-type acceptor (Na).

Figure 1B:
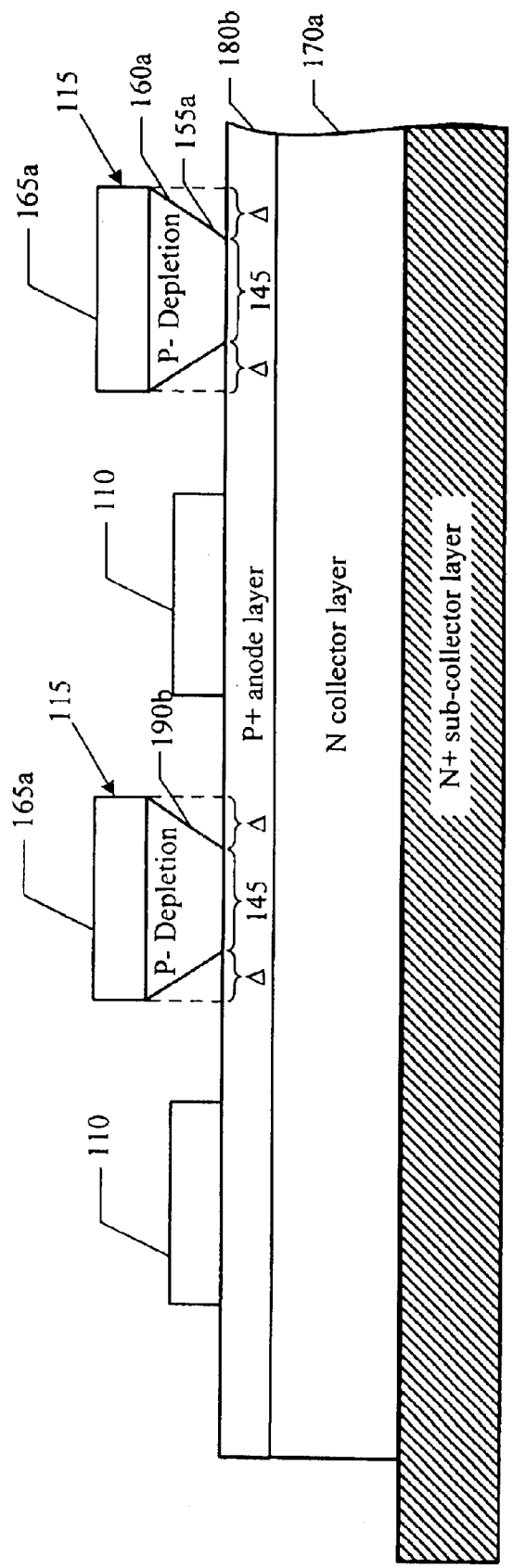
FIG. 1B is a cross-section view of the embodiment of the invention shown in FIG. 1 along the line 1B—1B and configured to find edge bias using current measurements.

FIG. 1B is a cross sectional view taken along section line 1B—1B for, in one embodiment, the first test fixture 100 illustrated in FIG. 1 with a P-P+ junction used to calculate etch bias from current measurements. As in the embodiment illustrated in FIG. 1A, the first cathode fingers 115 are on the anode layer 180b to establish the first junction 145. In the present embodiment, however, the N+ ohmic and N cathode layers (160, 155a) in the first cathode fingers 115 are replaced with a P− depletion layer 190b. Also, the anode layer 180b is doped P+ rather than P to establish the first junction 145 as a P-P+ junction.

The metal cathode contact 165a, P− depletion layer 180b, and P+ anode layer 180b establish a Schottky diode. Application of a voltage between the first anode and cathode pads (130, 120) results in a measurable current between them. The current through each first cathode finger, similar to equation (1) above describing capacitance, is a function of its length L and width W, etch bias Δ, and the perimeter current $J_P$ created between the etched vertical walls of the first cathode fingers 145 and the P+ anode layer 180b. More particularly, the measured current for each finger $J_F$ is described by:

$$J_F = J_A(L-\Delta)(W-\Delta) + 2J_P(L+W-2\Delta) \quad (2)$$

where $J_A$ is the current per unit area at the first junction 145 in response to a voltage. For the first test fixture 100 as described in Table 1, the P− depletion layer 290b would replace the N+ ohmic and N cathode layers (160a, 155a) and would have a thickness of approximately 0.2 microns. The forward voltage would be nominally 0.7 volts and reverse voltage approximately 5–10 volts, when designed for GaAs.

Figure 2:
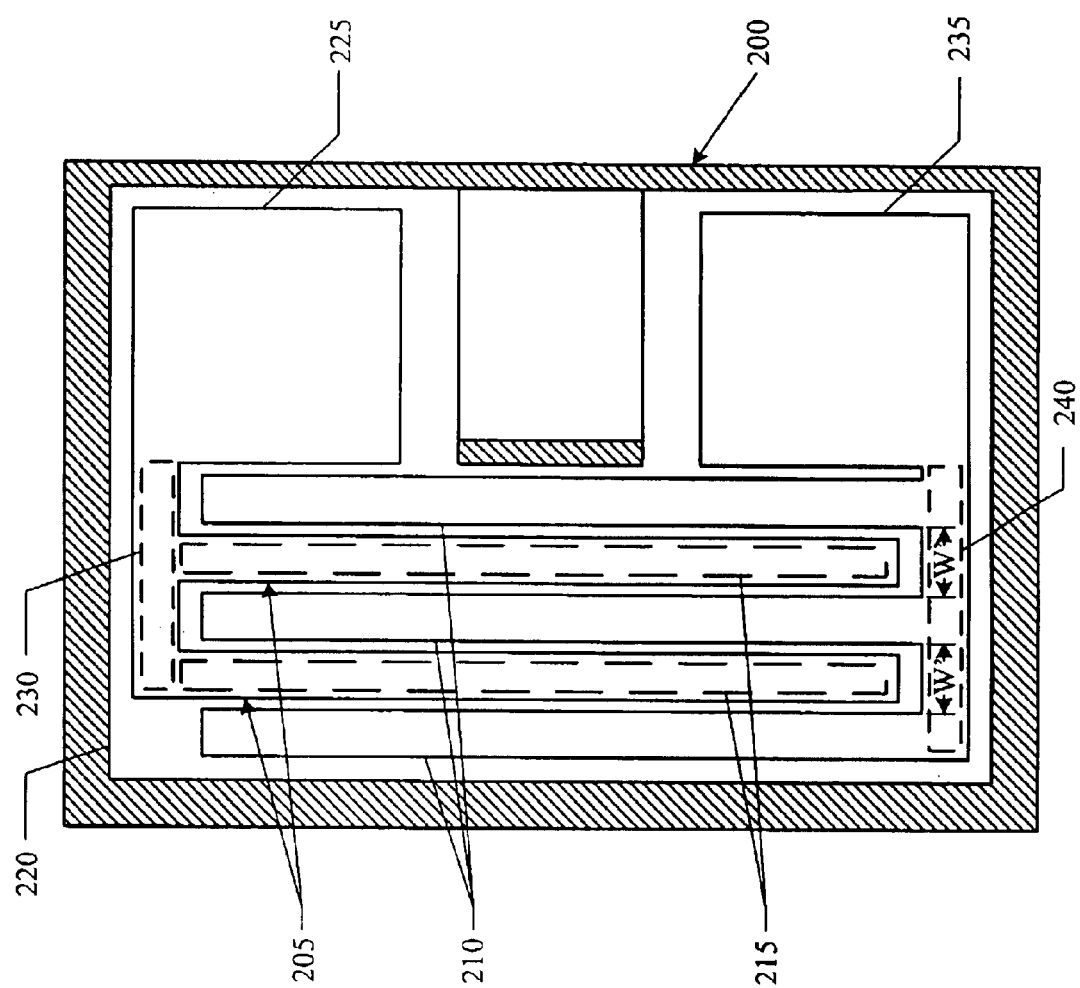
FIG. 2 is a cross-sectional view of a second test fixture on the semiconductor substrate of FIG. 1, illustrating interdigitated anode and cathode fingers, with the cathode fingers having a second width W'.

FIG. 2 is a plan view showing a second test fixture 200 that has second cathode fingers 205 of width W'. The second test fixture 200 is substantially similar in cross section to the first test fixture 100 and can establish a second PN junction or Schottky diode, with the exception that the second cathode fingers 210 in the second test fixture each have a different width than the first cathode fingers 115. The number and length L of the second cathode fingers 205 are approximately the same as the first 115. Second anode fingers 210 preferably share the same width W' as the second cathode fingers. A second junction 215 is established under each second cathode finger 205 at a second anode layer 220. As illustrated, the second cathode fingers have a smaller width W' than width W, although the second test fixture can have second cathode fingers 205 with a larger width W' than width W. The fingers 205 are coupled to a second cathode pad 225 through a second cathode bus 230 to provide electrical communication between the cathode pad and fingers (225, 205). The second anode fingers 210 are coupled to a second anode pad 235 through a second anode bus 240 to enable electrical communication between the fingers 210 and pad 225. The length L and width W' is greater than any anticipated etch bias Δ or process variation.

The purpose of the first and second test fixtures (100, 200) is to provide fingers with different widths to allow a solution for equations (6) through (9), (11) and (12) below, through a linear regression or some similar method, to solve for the etch bias Δ.

Figure 3A:
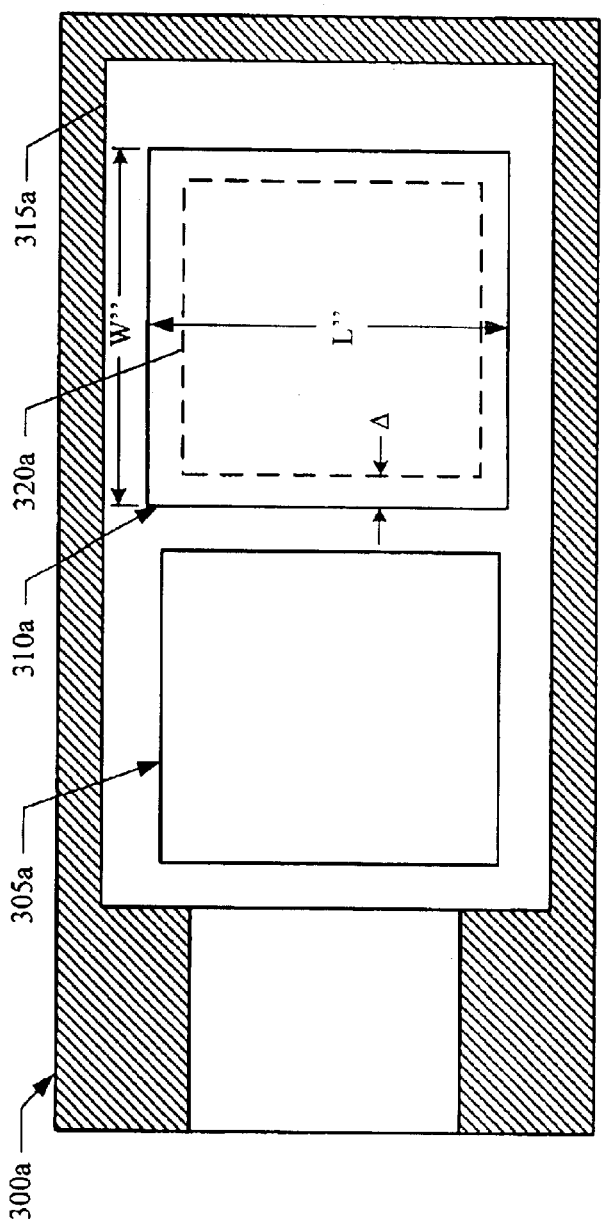
FIGS. 3A and 3B are a plan view and cross-section view, respectively, of a third test fixture that has, in one embodiment, a platform with a length L" approximately equal to a width W".
Figure 3B:
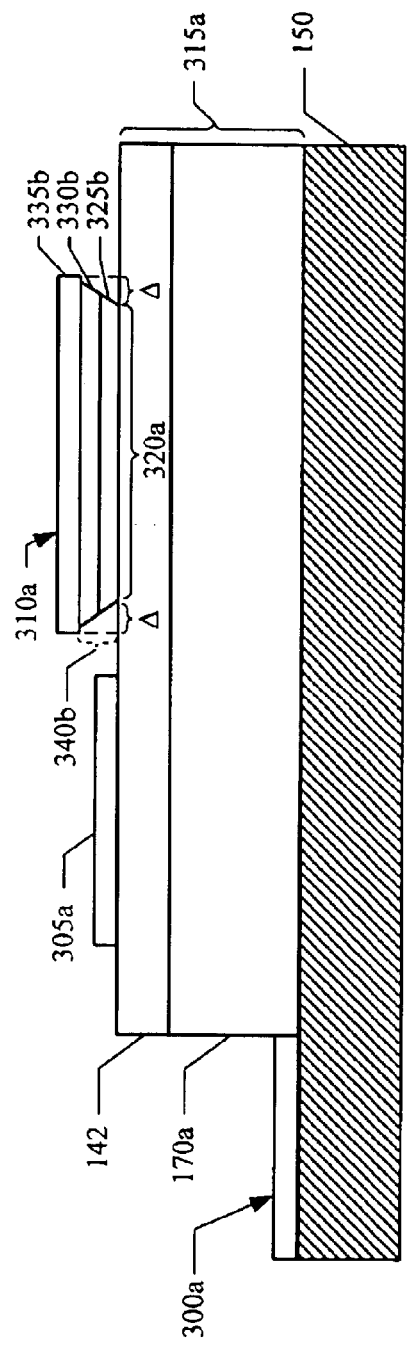

FIGS. 3A and 3B illustrate a third test fixture 300A used to determine either the unit area capacitance or current in response to a voltage for the first and second junctions (145, 175) for use in equations (3) through (12), below. The fixture has anode and cathode platforms (305a, 310a). The cathode platform's length L" and width W" are both substantially larger than process variation, etch bias Δ and either of finger widths W and W'. The anode platform's dimensions can be similar and are also substantially larger than process variation and etch bias Δ. A third pedestal 315A extends beneath the anode and cathode platforms (305A, 310A) and has a portion of the anode layer 142. It can also have a portion of the N collector layer 170a if the third test fixture is used as a transistor. In such a case, the N collector layer 170a would be on the N+ sub-collector layer 150. A third junction 320a (indicated by dashed lines) is established between an N doped cathode unit layer 325b of the cathode platform 310a and the P doped anode layer 142. An N+ doped ohmic layer 330b is on the N doped cathode layer 325b to establish an ohmic contact with a cathode platform contact 335b.

In an example implementation of the present embodiment, the cathode platform 310a has a 100:1 weighted area to perimeter ratio defined by equation (3), below.

$$\frac{C_{AT}(L''-\Delta)(W''-\Delta)}{2C_{PT}(L''+W''-2\Delta)} > 100 \quad (3)$$

$C_{AT}$ is the theoretical unit area capacitance, $C_{PT}$ is the theoretical unit perimeter capacitance, L" is the drawn length, W" is the drawn width, and Δ, the etch bias. By choosing L" and W" such that both are much larger than the etch bias, the analytical error for equation (1) is less than 1%. In an alternative implementation, lesser weighted area to perimeter ratios are used to facilitate chip layout, such as 50:1, keeping in mind the concomitant reduction in calculated etch bias accuracy. In another alternative implementation, the third test fixture 300 may not be square, but may consist of some other geometric shape where the weighted area to perimeter ratio is sufficiently large to reduce the effects of etch bias, Δ, on any measured capacitance.

In an alternative embodiment, the third test fixture 300a is configured as a Schottky diode to support current measurement in the first and second test fixtures. The N+ doped ohmic and N doped cathode layers (330b, 325b) would be replaced with a P− doped unit depletion layer 335b. The anode layer 145 would be P+ doped to establish the third junction 320a. The cathode platform 310a would have approximately the same 100:1 weighted area to perimeter ratio as in the previous embodiment, with the area to perimeter ratio defined by equation (4), below.

$$\frac{J_T(L''-\Delta)(W''-\Delta)}{2J_T(L''+W''-2\Delta)} > 100 \quad (4)$$

$J_T$ is the theoretical unit area current in response to a voltage, $JC_{PT}$ is the theoretical unit perimeter current, L" is the drawn length, W" is the drawn width, and $\Delta$, the etch bias.

Figure 4:
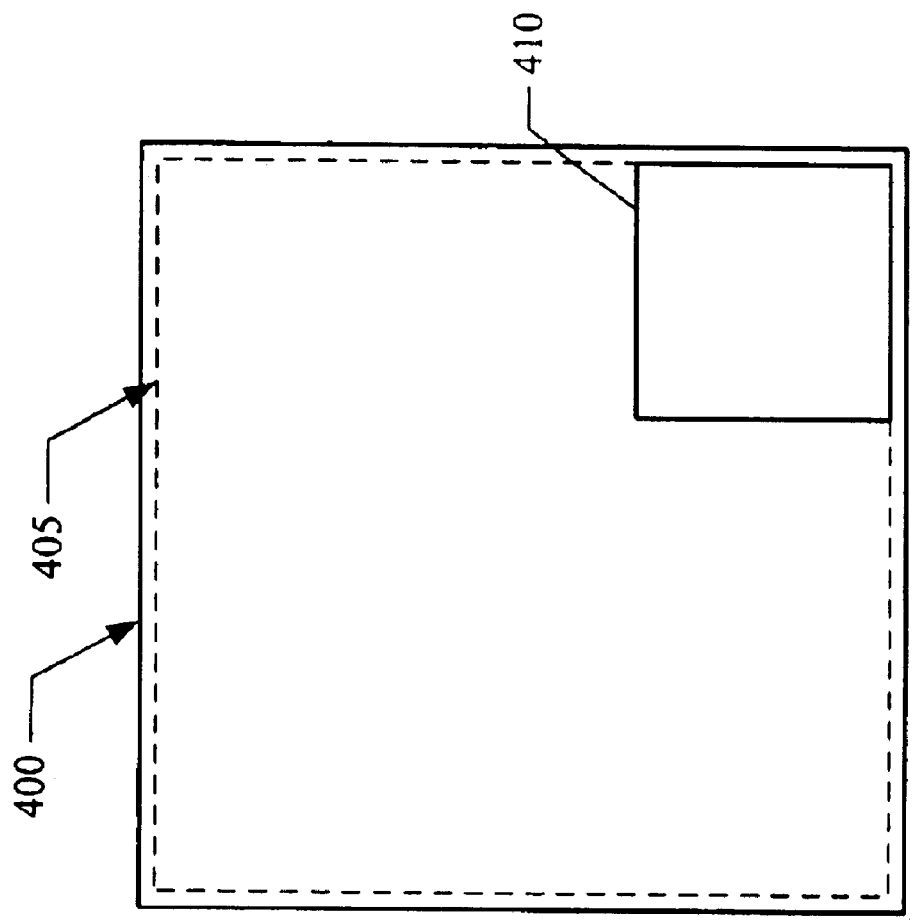
FIG. 4 is a plan view showing a sample die containing a test fixture area.

FIG. 4 is a schematic showing a sample die 400 with active area 405. Test fixture area 410 is located in die active area 405, and contains the first, second and third test fixtures (100, 200, 300). The test fixture area 410 is shown approximating 15% of the device active area. The amount of area required for the test fixtures is not critical to an implementation of the invention. Rather, the amount of active area required is dependent on the number and size of test fixtures desired by the designer. In an alternative implementation, the test fixture area is not co-located with every active area 405 on a die 400, but rather is implemented on only one section of a wafer containing many dies (not shown). In such a case, the anode and collector layers (142, 170a) may not be contiguous between test fixtures but may have approximately the same dimensions and dopant concentrations for a solution to the equations herein. Test fixture area 410 may also be provided off-wafer to test the substrate if subjected to the same or substantially similar process steps.

Figure 5:
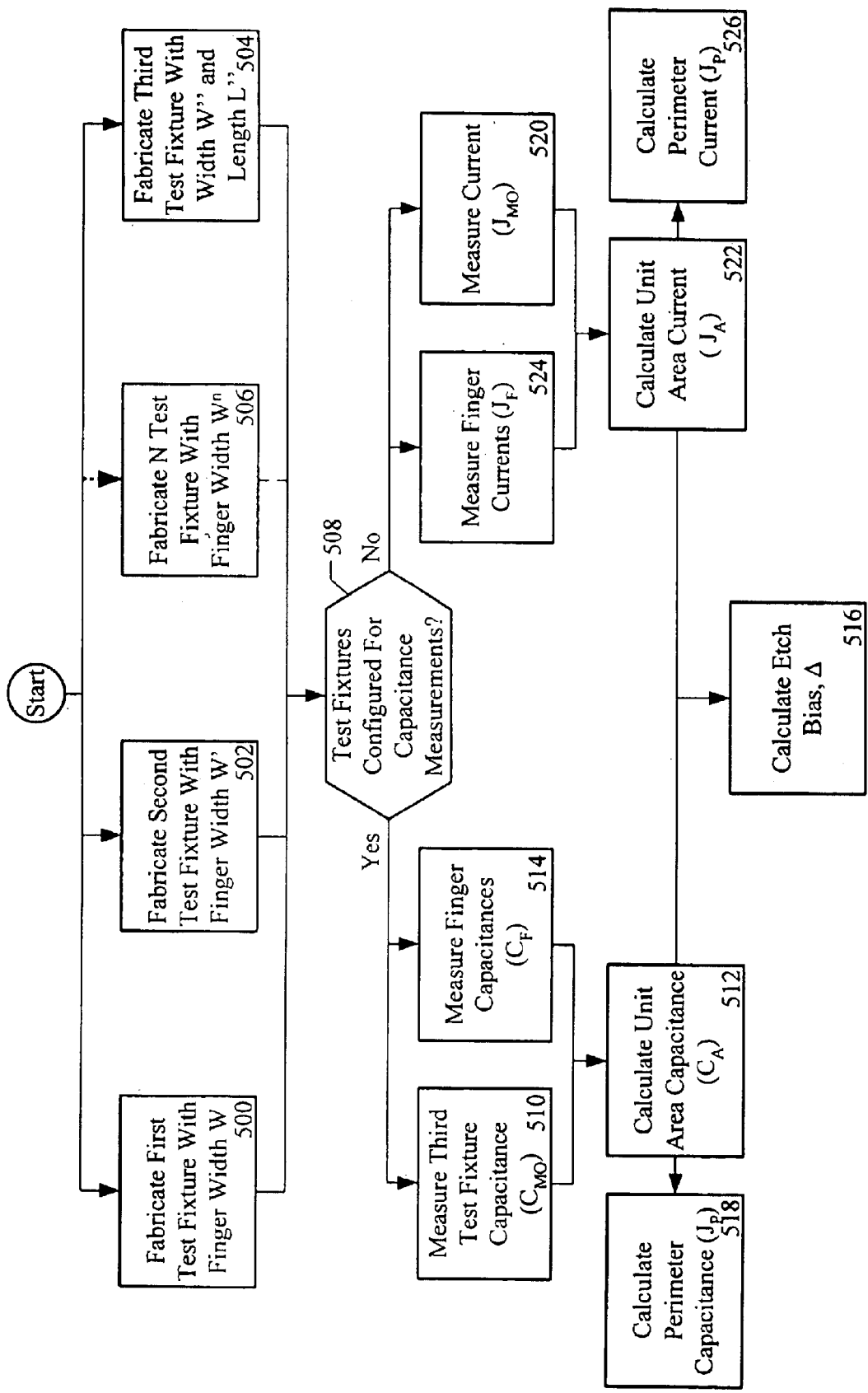
FIG. 5 is a flow diagram of a method for utilizing the test structure shown and described in FIGS. 1, 1A, 2, 3A, 3B and 4.

FIG. 5 is a flow diagram for using the test fixtures shown in FIGS. 1 through 4 to determine unit capacitance per unit length, (CP), and the etch bias, $\Delta$. Test fixture area 410 is fabricated with first, second and third test fixtures (100, 200, 300a) (blocks 500, 502, 504). In an alternative implementation, more than three test fixtures may be created (block 506). If the test fixtures are configured for capacitance measurements (block 508), the capacitance CMO between the cathode and anode platforms (310a, 305a) is measured (block 510) to calculate the unit area capacitance $C_A$ (block 512) of the third junction 320a. Unit area capacitance $C_A$ is expressed as a function of $C_{MO}$ by the equations, $$C_A = C_{MO}/L''W'' \quad (5)$$

In an alternative implementation, the area of the large area fixture 300a is not expressed as length L" multiplied by width W", but rather by some other appropriate calculation.

The finger capacitance $C_F$, is measured (block 514) for each of the test fixtures 100, 200 having different finger widths. Analytically, $C_F$ is expressed by the equation, $$C_F = C_A(L-\Delta)(W-\Delta) + 2C_P(L+W-2\Delta) \quad (6)$$

L and W are known quantities. $C_A$ is calculated from equation (5) and etch bias $\Delta$ and perimeter capacitance $C_P$ can be calculated (blocks 516, 518) with a linear regression of $C_F(W)$ versus W. The slope of the resultant line is $C_A L$ and the y-intercept is $2C_P L$ (at W=0). The slope and y-intercept can be determined analytically from equations (7) and (8):

$$\frac{dC_P}{dW} = C_A \Delta + 2C_P + LC_A \quad (7)$$

$$C_F(W=0) = C_A \Delta^2 - LC_A \Delta - 4C_P \Delta + 2LC_P \quad (8)$$

Combining these two equations, $C_P$ is eliminated from the analysis to yield the following quadratic equation for $\Delta$.

$$\Delta = \left( \frac{dC_F}{dW} \pm \sqrt{\left(\frac{dC_F}{dW}\right) - 3C_A \left(L\frac{dC_F}{dW} - C_{F0} - L^2 C_A\right)} \right) / 3C_A \quad (9)$$

With $\Delta$ determined, $\Delta$ is substituted back into equations 6a and 6b to determine $C_P$ (block 518).

With $\Delta$ determined, the model of the device may be updated to improve the accuracy of calculated specifications or the device's layout may be changed to improve manufacturing accuracy.

If the test fixtures are configured for current measurements (block 508), the current $J_{MO}$ between the cathode and anode platforms (310a, 305a) is measured (block 520) in response to a voltage applied between them to calculate the unit area current $J_A$ (block 512) of the third junction 320a. The unit area current $J_A$ is expressed as a function of $J_{MO}$ by the equation, $$J_A = J_{MO}/L''W'' \quad (10)$$

The finger current $J_F$, is measured (block 524) between each of the anode and cathode pads (130/120, 235/225) for each of the test fixtures 100, 200 having different finger widths. Similar to the equation (6) for capacitance, $J_F$ is expressed by the equation, $$J_F = J_A(L-\Delta)(W-\Delta) + 2J_P(L+W-2\Delta) \quad (11)$$

$J_A$ is calculated from equation (10) and etch bias $\Delta$ and perimeter current $J_P$ can be calculated (blocks 516, 526) with a linear regression of $J_F(W)$ versus W. The slope and y-intercept can also be determined analytically using equations (7) and (8), substituting current for capacitance to find:

$$\Delta = \left( \frac{dJ_F}{dW} \pm \sqrt{\left(\frac{dJ_F}{dW}\right) - 3J_A \left(L\frac{dJ_F}{dW} - J_{F0} - L^2 J_A\right)} \right) / 3J_A \quad (12)$$

In an example implementation, both $C_F$ and $J_F$ may be measured over different voltages. This may reduce irregularities in measurements due to non-idealities such as surface effects. Also, as another means to reduce error, when capacitance is used to calculate $\Delta$, other variables may be introduced for each test fixture such as $C_M$, the measured capacitance of the test fixture, $C_{ERR}$, the total capacitance error correction, $C_{PAD}$, the total capacitance for the pads 212, 206, $C_{WIRE}$, the total wiring capacitance, and n, the number of fingers in the test fixture. In general, $C_{WIRE}$ and $C_{PAD}$ are the capacitances associated with the measurement, but do not scale with the number of fingers in a text fixture. The four variables are defined as follows:

$$C_{ERR} = C_{PAD} + C_{WIRE} \quad (13)$$

$$C_M = nC_F + C_{ERR} \quad (14)$$

To implement these additional error reduction measures; three W values are used. $C_P$, $C_A$, $\Delta$, and L are fixed values based on the test fixture and semiconductor processing. Therefore, as before, a line of $C_M(W)$ versus W or $C_F(W)$ versus W is generated so that the slope and intercept of the data can be found to determine $C_P$ and $\Delta$. Also, each test fixture includes preferably 25–50 test fingers to increase the relative capacitance of the test fingers in comparison to $C_{ERR}$.

While various embodiments of the application have been described, it will be apparent to those of ordinary skill in the art that many more embodiments and implementations are possible that are within the scope of this invention.

What is claimed is:

1. A method of calculating etch bias Δ in a semiconductor-processing step, comprising:

measuring a capacitance between cathode and anode platforms to calculate a unit area capacitance;

measuring a first finger capacitance between a first cathode finger and first anode finger both having a first width;

measuring a second finger capacitance between a second cathode finger and second anode finger both having a second width different than the first width;

calculating the etch bias, Δ, from the unit area capacitance, the first finger capacitance and first finger width, and the second finger capacitance and second ringer width.

2. A method according to claim 1, wherein calculating an etch bias, Δ, from the unit area capacitance, the first finger capacitance and the second finger capacitance further comprises:

performing a linear regression on $C_F(W)$ verses W described by $$C_F = C_A(L-\Delta)(W-\Delta) + 2C_P(L+W-2\Delta)$$

to find $C_F(W=0)$ where $C_F$ is the cathode capacitance of a cathode finger, $C_A$ is the unit area capacitance, L and W are the length and width, respectively, of the first cathode finger, first anode finger, second cathode finger and second anode finger.

3. A method of calculating etch bias Δ in a semiconductor-processing step, comprising:

measuring a current response to a voltage applied across cathode and anode platforms to calculate a unit area current;

measuring a current response to a voltage applied across a first cathode finger and first anode finger both having a first width;

measuring a current response to a voltage applied across a second cathode finger and second anode finger both having a second width different than the first width;

calculating the etch bias, Δ, from the unit area current, the first finger current response and first finger width, and the second finger current response and second finger width.

4. A method according to claim 1, wherein calculating an etch bias, Δ, from the unit area current, the first finger current response and the second finger current response further comprises:

performing a linear regression on $C_F(W)$ verses W described by $$J_F = J_A(L-\Delta)(W-\Delta) + 2J_P(L+W-2\Delta)$$

to find $J_F(W=0)$ where $J_F$ is the cathode current of a cathode finger, $J_A$ is the unit area current, L and W are the length and width, respectively, of the first cathode finger, first anode finger, second cathode finger and second anode finger.

* * * * *